(12) United States Patent
McStay

(10) Patent No.: US 6,381,182 B1
(45) Date of Patent: Apr. 30, 2002

(54) COMBINED TRACKING OF WLL AND VPP LOW THRESHOLD VOLTAGE IN DRAM ARRAY

(75) Inventor: Kevin McStay, Hopewell Junction, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/659,946

(22) Filed: Sep. 13, 2000

(51) Int. Cl.⁷ .................................................. G11C 7/00
(52) U.S. Cl. .............................. 365/189.09; 365/189.11; 365/226
(58) Field of Search ................................ 365/210, 226, 365/189.09, 189.07, 189.11; 323/282, 284, 280, 266; 327/541, 581

(56) References Cited

U.S. PATENT DOCUMENTS

| 5,063,304 A | * | 11/1991 | Iyengar | 327/310 |
| 5,087,834 A | * | 2/1992 | Tsay | 326/33 |
| 5,998,981 A | * | 12/1999 | Houghton et al. | 323/282 |

\* cited by examiner

*Primary Examiner*—Shawn Riley

(57) ABSTRACT

In generating first and second voltages (VPP and WLL) for respectively activating and deactivating transistors of a DRAM array that transfer charge to cells of the DRAM array, the second voltage can be lowered to compensate for a threshold voltage (Vt) that is lower than a nominal threshold voltage value ($Vt_{NOM}$). Furthermore, the first voltage is tracked together with the second voltage in order to maintain a generally constant voltage swing ($V_{sw}$) therebetween.

20 Claims, 3 Drawing Sheets

COMBINED TRACKING OF WLL AND VPP LOW THRESHOLD VOLTAGE IN DRAM ARRAY

FIELD OF THE INVENTION

The invention relates generally to generation of VPP and WLL voltages for a DRAM array and, more particularly, to generation of such voltages for use with a lower-than-nominal array threshold voltage.

BACKGROUND OF THE INVENTION

In conventional DRAM arrays, information is stored in a given DRAM cell by driving a wordline WL appropriately to activate a transfer transistor (whose gate is connected to the wordline) and thereby transfer charge into the cell capacitor. In general, the retention time of the cell, and thus the performance thereof, increases with the amount of charge transferred to the cell. The transfer transistor of a given cell is activated for transferring charge into the cell by application of a voltage VPP to the wordline, and the transfer transistor is switched off by application of a voltage WLL (wordline low) to the wordline. This is illustrated generally in FIG. 1.

In order to transfer the maximum possible charge to the cell, a large VPP must be applied to the gate of the transfer transistor via wordline WL. More specifically, VPP must be much greater than the threshold voltage Vt of the transfer transistor. Due to performance (i.e., speed) requirements, the time available to transfer the charge into the cell is limited, and is typically reduced with each new generation of DRAM arrays. Increases in the VPP voltage permit reductions in the charge transfer time. However, due to reliability concerns, the maximum VPP is limited due to the maximum allowable electric field across the gate oxide of the transfer transistor.

Due to normal process variations, the threshold voltage Vt of the transfer transistor can be higher than the nominal threshold voltage $Vt_{NOM}$, which reduces the voltage difference VPP−Vt (also referred to as the overdrive), thereby reducing the charge transfer to the cell. This disadvantageously impacts the cell's retention capability and thus the product yield.

Conventional DRAM array chips include VPP tracking circuits that basically measure the threshold voltage Vt of one (or several) transfer transistors, and then increase the VPP voltage, if required, to maintain a desired overdrive (VPP−Vt), thereby insuring that the maximum charge is always transferred to the cell. Although such VPP tracking can be used to compensate for a higher-than-normal Vt, nevertheless the maximum value of VPP is limited by the aforementioned gate oxide reliability considerations. In fact, due to the thinner gate oxides used in the latest DRAM technologies, the nominal VPP value is approaching the reliability limit of the gate oxide, so the aforementioned VPP tracking is no longer a viable option because the VPP voltage typically cannot be increased beyond its nominal value.

When a DRAM array has a lower-than-nominal threshold voltage, the WLL voltage may not completely shut off the transfer transistor, in which case the charge can leak out of the cell capacitor, thereby disadvantageously reducing the cell retention time and disadvantageously impacting the product yield. Conventional DRAMs typically use a grounded WL scheme, wherein the WLL voltage is fixed and cannot be lowered below 0V. Thus, with the grounded WL scheme, a lower-than-nominal threshold voltage cannot be compensated for by reducing the WLL voltage.

It is therefore desirable to provide compensation for lower-than-nominal threshold voltage in a DRAM array, thereby improving the cell retention time and the product yield.

The present invention utilizes a negative wordline low (NWLL) scheme that permits lowering WLL to compensate for a lower-than-nominal threshold voltage. Further according to the invention, VPP is tracked together with WLL in order to maintain a generally constant voltage swing therebetween, thereby advantageously avoiding damage to the gate oxides in the wordline driver circuits. After determining a desired overdrive voltage (VPP−Vt) and a desired voltage swing between VPP and WLL, VPP can be tracked with the lower-than-nominal threshold voltage to maintain the desired overdrive voltage, and WLL can be tracked with VPP to maintain the desired voltage swing between VPP and WLL.

DETAILED DESCRIPTION

Figure 1:
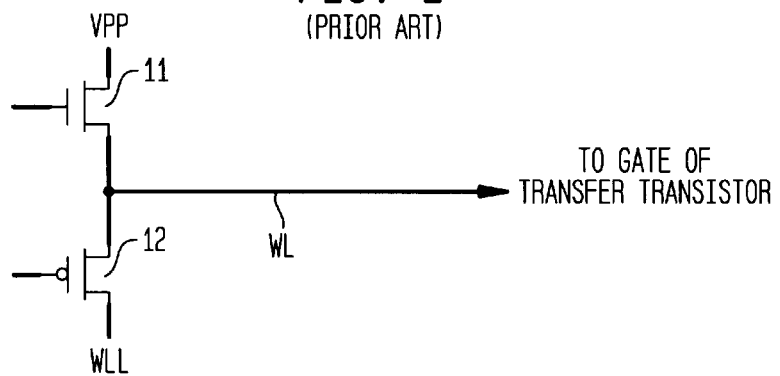
FIG. 1 illustrates a conventional arrangement for applying VPP and WLL voltages to the gate of a transfer transistor that transfers charge to a capacitor of a DRAM array.

The present invention recognizes that a lower-than-nominal DRAM array threshold voltage can be compensated for by using a negative wordline low (NWLL) scheme and appropriately lowering WLL advantageously to compensate for the lower-than-nominal threshold voltage. However, and as can be seen from FIG. 1, lowering the WLL voltage while maintaining a fixed VPP voltage will undesirably increase the voltage across the gate oxides of the wordline driver transistors 11 and 12. Therefore, according to the invention, the WLL voltage in a NWLL scheme can be lowered to compensate for a lower-than-nominal threshold voltage, and VPP can advantageously track together with WLL in order to maintain a generally constant voltage swing between VPP and WLL and thus a generally constant voltage across the gate oxides of the driver transistors 11 and 12.

Figure 2:
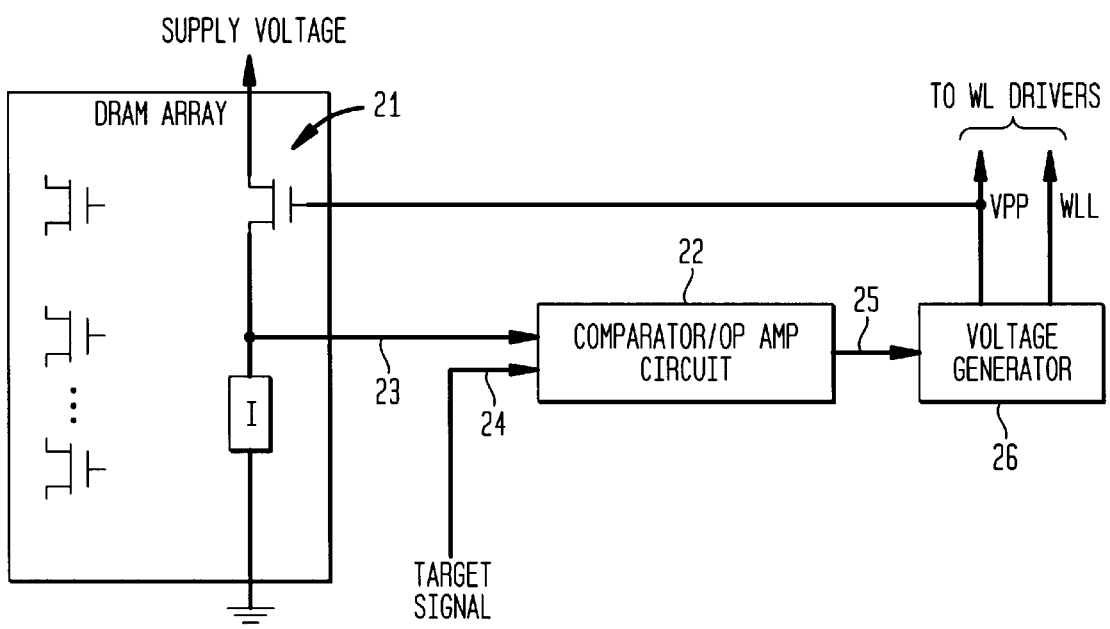
FIG. 2 diagrammatically illustrates exemplary embodiments of a voltage tracking circuit which tracks VPP and WLL with a lower-than-nominal Vt according to the invention.

FIG. 2 diagrammatically illustrates exemplary embodiments of a voltage tracking circuit which permits VPP and WLL to be tracked together with a lower-than-nominal array threshold voltage Vt. In FIG. 2, a single transfer transistor 21 of a DRAM array is used as a test transistor. The test transistor 21 is specially wired to a known impedance 1 so that the drive current of the test transistor 21 can be measured, and a signal (e.g., a voltage) 23 indicative of the drive current can be provided to a comparator/operational amplifier circuit 22. The circuit 22 includes another input 24 which is coupled to receive a target signal analogous to the signal 23, but indicative of the drive current that the test transistor 21 would be expected to produce under nominal threshold voltage conditions. Thus, the target signal 24 corresponds to the nominal threshold voltage $Vt_{NOM}$.

The comparator/operational amplifier circuit 22 is responsive to the input signals 23 and 24 for determining whether the actual threshold voltage $Vt_{ACT}$ (represented by signal 23) of the DRAM array is less than the nominal threshold voltage Vt $_{NOM}$ (represented by signal 24). If the circuit 22 determines that the actual threshold voltage is below the nominal threshold voltage, then an output 25 from the circuit 22 signals a VPP and WLL voltage generator 26 to reduce its WLL output accordingly to compensate for the lower-than-nominal threshold voltage. The generator 26 also reduces its VPP output to maintain a generally constant voltage swing between VPP and WLL.

The generator 26 initially sets VPP and WLL to respective nominal values. The nominal value of VPP can be determined, for example, by adding the desired overdrive voltage to the nominal threshold voltage. Thus, for a nominal array threshold voltage, the nominal VPP applied to the gate of the test transistor 21 will produce the desired overdrive and a corresponding expected drive current through the impedance I. However, a lower-than-nominal threshold voltage will produce a higher-than-desired overdrive and thus a larger than expected drive current through the impedance I. The comparator/operational amplifier circuit 22 will detect this condition and respond by outputting at 25 to generator 26 a signal indicative of how much the actual threshold voltage differs from the nominal threshold voltage. The generator 26 responds to this signal by decreasing the value of VPP until the desired overdrive is achieved and circuit 22 signals at 25 that the expected current is produced through the impedance I. The generator 26 also adjusts WLL in conjunction with VPP to maintain the desired constant voltage swing between VPP and WLL.

On the other hand, if the current through the impedance I is less than or equal to the current that is expected with the nominal value of VPP applied to the gate of test transistor 21, this indicates that the array threshold voltage is greater than or equal to the nominal threshold voltage, so the comparator/operational amplifier circuit 22 signals the generator 26 to maintain VPP and WLL at their respective nominal levels.

Figure 3:
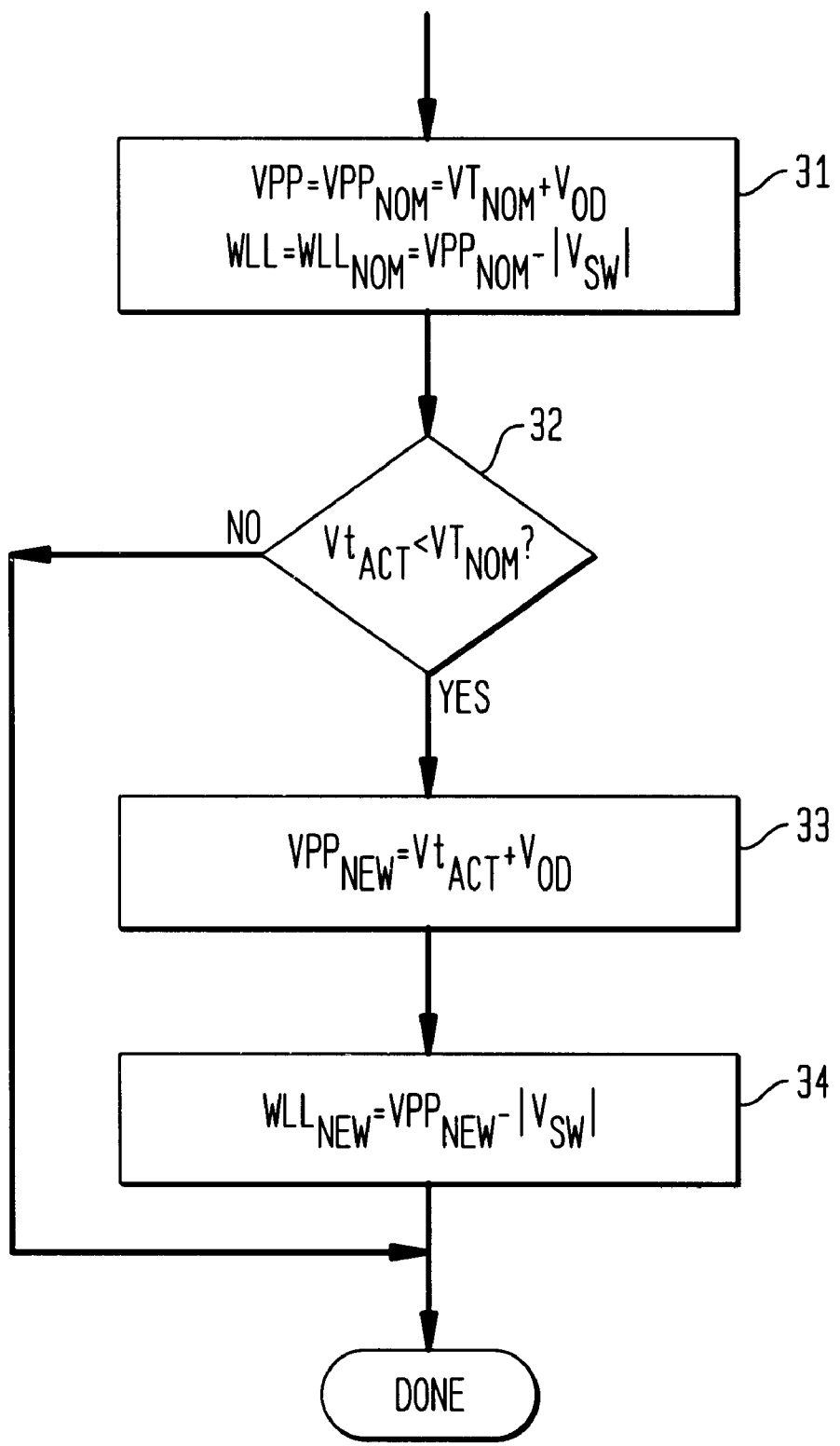
FIG. 3 illustrates exemplary operations which can be performed by the voltage tracking circuit of FIG. 2.

FIG. 3 illustrates exemplary operations which can be performed by the voltage tracking circuit of FIG. 2, typically at the time that the DRAM array is powered up. At 31, VPP is set to its nominal value, $VPP_{NOM}$, by adding the desired overdrive voltage $V_{OD}$ to the nominal threshold voltage $Vt_{NOM}$. Also at 31, WLL is set to its nominal value, $WLL_{NOM}$, by subtracting from $VPP_{NOM}$ the value of the voltage swing $V_{SW}$ desired between VPP and WLL. It is then determined at 32 whether the actual threshold voltage VtAcT is less than the nominal threshold voltage $Vt_{NOM}$. If not, then operations are completed and the nominal values $VPP_{NOM}$ and $WLL_{NOM}$ will be used. On the other hand, if the actual threshold voltage is less than the nominal threshold voltage, then a new VPP, $VPP_{NEW}$, is generated as the sum of the desired overdrive voltage $V_{OD}$ and the actual threshold voltage Vt $_{ACT}$. At 34, a new WLL, $WLL_{NEW}$, is generated by subtracting from $VPP_{NEW}$ the value of the desired voltage swing $V_{SW}$.

Figure 4:
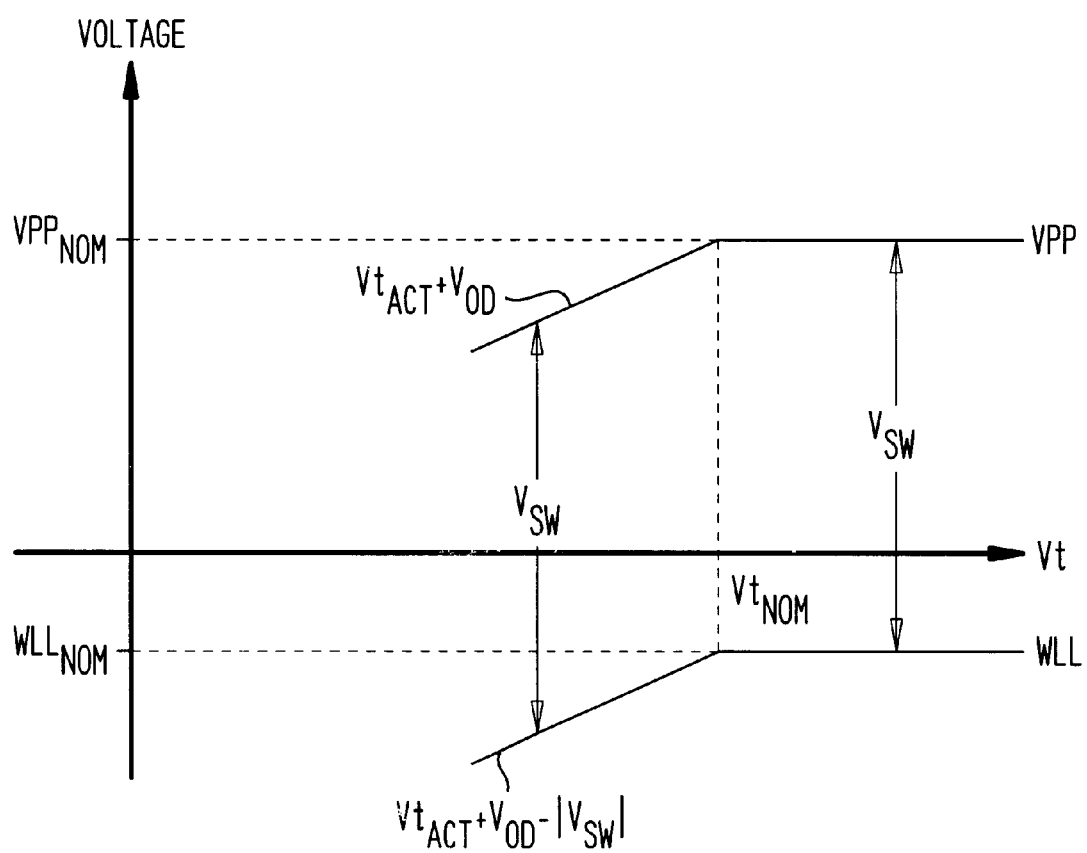
FIG. 4 graphically illustrates the operation of the voltage tracking circuit of FIG. 2.

The exemplary voltage tracking operations described above with respect to FIGS. 2 and 3 are illustrated by a graphic example in FIG. 4. As described above, WLL can be advantageously lowered to compensate for a lower-than-nominal threshold voltage, while still advantageously maintaining an approximately constant voltage swing ($V_{SW}$) between VPP and WLL, and an approximately constant overdrive voltage $V_{OD}$.

Although exemplary embodiments of the invention are described above in detail, this does not limit the scope of the invention, which can be practiced in a variety of embodiments.

What is claimed is:

1. A method of providing first and second voltages for respectively activating and deactivating transistors of a DRAM array that transfer charge to cells of the DRAM array, comprising:

determining whether an actual threshold voltage associated with said transistors is lower than a nominal threshold voltage nominally associated with said transistors; and if the actual threshold voltage is lower than the nominal threshold voltage, setting the first and second voltages to respective first and second levels based on the actual threshold voltage.

2. The method of claim 1, including setting the first and second voltages to respective third and fourth levels that are determined based on the nominal threshold voltage and are respectively different than the first and second levels, said first-mentioned setting step including changing the first and second voltages from the respective third and fourth levels to the respective first and second levels based on the actual threshold voltage.

3. The method of claim 2, wherein said third and fourth levels are respectively higher than said first and second levels.

4. The method of claim 1, including setting one of the first and second voltages to a third level that is determined based on the nominal threshold voltage and is higher than the one of said first and second levels to which said one voltage is set in said first-mentioned setting step, said first-mentioned setting step including lowering said one voltage from the third level to the corresponding one of said first and second levels based on the actual threshold voltage.

5. The method of claim 4, including setting the other of the first and second voltages to a fourth level that is determined based on the third level and is higher than the one of said first and second levels to which said other level is set in said first-mentioned setting step, said first-mentioned setting step including lowering said other voltage from the fourth level to the corresponding one of said first and second levels based on the one of said first and second levels to which said one voltage is set in said first-mentioned setting step.

6. The method of claim 5, wherein said first and second levels differ from one another by an amount that is approximately equal to an amount by which said third and fourth levels differ from one another.

7. The method of claim 6, wherein said one voltage is the first voltage and said other voltage is the second voltage, and wherein the first level differs from the actual threshold voltage by an amount approximately equal to an amount by which the third level differs from the nominal threshold voltage.

8. The method of claim 5, wherein said one voltage is the first voltage and said other voltage is the second voltage, and wherein the first level differs from the actual threshold voltage by an amount approximately equal to an amount by which the third level differs from the nominal threshold voltage.

9. The method of claim 4, wherein said one voltage is the first voltage, and wherein said first level differs from the actual threshold voltage by an amount approximately equal to an amount by which the third level differs from the nominal threshold voltage.

10. The method of claim 1, wherein said determining step includes using one of the first and second voltages to determine whether the actual threshold voltage is lower than the nominal threshold voltage.

11. The method of claim 10, wherein said using step includes using the first voltage to determine whether the actual threshold voltage is lower than the nominal threshold voltage.

12. An apparatus for providing first and second voltages for respectively activating and deactivating transistors of a DRAM array that transfer charge to cells of the DRAM array, comprising:

an input for receiving information indicative of whether an actual threshold voltage associated with said transistors is lower than a nominal threshold voltage nominally associated with said transistors; and a voltage generator having an output for providing said first and second voltages, said voltage generator coupled to said input and responsive to an indication that the actual threshold voltage is lower than the nominal threshold voltage for setting the first and second voltages to respective first and second levels based on the actual threshold voltage.

13. The apparatus of claim 12, wherein said voltage generator is operable for changing the first and second voltages from respective third and fourth levels to the respective first and second levels based on the actual threshold voltage, wherein said third and fourth levels are determined based on the nominal threshold voltage and are respectively different than the first and second levels.

14. The apparatus of claim 13, wherein said third and fourth levels are respectively higher than said first and second levels.

15. The apparatus of claim 13, wherein said first and second levels differ from one another by an amount that is approximately equal to an amount by which said third and fourth levels differ from one another.

16. The apparatus of claim 15, wherein said first level differs from the actual threshold voltage by an amount approximately equal to an amount by which the third level differs from the nominal threshold voltage.

17. The apparatus of claim 12, including a detecting circuit having an input connected to a transistor of the DRAM array for receiving information indicative of the actual threshold voltage and having a further input for receiving information indicative of the nominal threshold voltage, said detecting circuit having an output coupled to said first-mentioned input, said detecting circuit responsive to said detecting circuit inputs for providing at said detecting circuit output said information indicative of whether the actual threshold voltage is lower than the nominal threshold voltage.

18. The apparatus of claim 17, wherein said output of said voltage generator is coupled to a gate of the transistor to which said detecting circuit is coupled for applying one of said first and second voltages to said gate.

19. The apparatus of claim 18, wherein said voltage generator is operable for applying said first voltage to said gate.

20. The apparatus of claim 17, wherein said detecting circuit is an operational amplifier circuit.

* * * * *